United States Patent [19]

Sugawara et al.

[11] Patent Number: 5,287,385
[45] Date of Patent: Feb. 15, 1994

[54] VITERBI DECODING SYSTEM INCLUDING VARIABLE-ORDER EQUALIZER

[75] Inventors: Takao Sugawara; Yoshifumi Mizoshita; Hiroshi Mutoh; Kiichirou Kasai; Takenori Ohshima, all of Kawasaki, Japan

[73] Assignee: Fujitsu Limited, Kanagawa, Japan

[21] Appl. No.: 810,069

[22] Filed: Dec. 19, 1991

[30] Foreign Application Priority Data

Dec. 20, 1990 [JP] Japan ................. 2-411925

[51] Int. Cl.$^5$ ............................. H03H 7/30
[52] U.S. Cl. ...................... 375/12; 375/94; 371/43
[58] Field of Search ........ 375/12, 11, 13, 14, 375/15, 16, 94, 101; 371/43

[56] References Cited

U.S. PATENT DOCUMENTS

| | | | |
|---|---|---|---|
| 4,468,786 | 8/1984 | Davis | 375/11 |
| 4,571,734 | 2/1986 | Dolivo et al. | 375/94 |
| 4,644,564 | 2/1987 | Dolivo et al. | |
| 4,788,694 | 11/1988 | Calderbank | |
| 5,029,186 | 7/1991 | Maseng et al. | 375/101 |
| 5,031,195 | 7/1991 | Chevillat et al. | 375/14 |

FOREIGN PATENT DOCUMENTS

| | | |
|---|---|---|
| 332290 | 9/1989 | European Pat. Off. |
| 363551 | 4/1990 | European Pat. Off. |
| 370772 | 5/1990 | European Pat. Off. |
| 425458 | 5/1991 | European Pat. Off. |
| 63-166332 | 7/1988 | Japan |
| 2198015 | 6/1988 | United Kingdom |

OTHER PUBLICATIONS

Search Report from the European Patent Office dated May 28, 1993.
Japanese Patent Abstract No. JP62274827 dated Nov. 28, 1987.
Lopes, L. B.; Performance of Viterbi Equalisers for the GSM System (pp. 61–66).
Cioffi, et al; A Survey of Adaptive Equalization for Magnetic-Disk Storage Channels (pp. 20–24).

*Primary Examiner*—Curtis Kuntz
*Assistant Examiner*—Hai H. Phan
*Attorney, Agent, or Firm*—Nikaido, Marmelstein, Murray & Oram

[57] ABSTRACT

A Viterbi decoding system includes a characteristic estimator for estimating a characteristic of a system, and an equalizer for receiving an input signal from the system and for equalizing a waveform of the input signal so that an equalized waveform of the input signal is varied based on the characteristic of the system estimated by the characteristic estimator. A Viterbi decoder generates an output signal showing a maximum-likelihood path by using the equalized waveform of the input signal from the equalizer.

17 Claims, 16 Drawing Sheets

VITERBI DECODING SYSTEM INCLUDING VARIABLE-ORDER EQUALIZER

BACKGROUND OF THE INVENTION (1) Field of the Invention

The present invention generally relates to a Viterbi decoding system used to decode a digital signal in a digital signal processing system, such as a magnetic recording/reproducing apparatus.

(2) Description of the Related Art

In a magnetic recording/reproducing apparatus, such as a magnetic disk apparatus, intersymbol interference of a read signal increases as the recording density of the apparatus increases. A Viterbi decoder, which is based on a maximum-likelihood sequence, is used to decode such a read signal having intersymbol interference.

FIG. 1 is a block diagram of a conventional data transmission system, which includes a convolutional encoder 11, a transmission path 12, a waveform equalizer 13 and a Viterbi decoder 14. The convolutional encoder 11 positioned on the transmitter side convolutionally codes transmission data. The coded data is affected by intersymbol interference while it is transmitted via the transmission path 12. That is, data received by the waveform equalizer 13 has intersymbol interference. The waveform equalizer 13 shapes the waveform of the received data signal. The Viterbi decoder 14 corrects an error in the data signal having the shaped waveform. The Viterbi decoder 14 includes an ACS (Adder/Comparator/Selector) circuit, a path memory and a path selector. These structural elements are based on a constraint length of a convolutional code. The read signal of a magnetic recording/reproducing apparatus, such as a magnetic disk apparatus, has a waveform affected by intersymbol interference like the transmission signal as described above. Hence, it is possible to decode the read signal by the maximum-likelihood process.

FIG.2 is a block diagram of a conventional recording/reproducing apparatus. The apparatus shown in FIG.2 uses a partial-response maximum-likelihood technique. Recorded data is precoded by a precoder 21 and then coded into an NRZI (Non Return Zero Inverse) code by an NRZI encoder 22. The NRZI code is recorded on a magnetic recording/reproducing device 23. The NRZI code is read out from the magnetic recording/reproducing device 23 and is then waveform-equalized by an equalizer 24. The waveform-equalized signal from the equalizer 24 is decoded by a Viterbi decoder 25.

Assuming that a delay time of a bit period of the recorded data is D, an NRZI recording system in which only data "1" is magnetically inverted by the NRZI encoder 22 has a characteristic described by $[1/(1-D)]\mod 2$. Further, the characteristic of the magnetic recording/reproducing device 23 is written as $(1-D)$, and the characteristic of the equalizer 24 is written as $(1+D)$. Assuming that the precoder 21 has a characteristic of $[1/(1+D)]\mod 2$, a composite characteristic of the precoder 21 and the NRZI recording system is the reverse of a composite characteristic of the magnetic recording/reproducing apparatus 23 and the equalizer 24. Hence, the Viterbi decoder 25 receives the read signal in which it alternately has plus and minus polarities and hence the characteristics of the recording and reproduction are canceled.

FIG.3 is a block diagram of the Viterbi decoder 25 shown in FIG.2. As shown, the Viterbi decoder 25 is composed of an assumed-path memory 31, an ACS circuit 32, a path memory 33 and a path selector 34. The assumed-path memory 31 stores expected values obtained from the waveform of a data train composed of a number of bits corresponding to the constraint length. The ACS circuit 32 includes an adder (A), a comparator (C) and a selector (S). The adder adds, for each of the expected values, a square of the difference between a sampled value of a waveform-equalized read signal from the equalizer 24 and the expected value and a path metric value previously calculated. The comparator compares the added values. The selector selects the smallest one of the added values. The value positioned at the end of a selected assumed path is written into the path memory 33. The value written into the path memory 33 is not a maximum-likelihood value as decoded data, but a likelihood value obtained at the present time. The path selector 34 selects the smallest one of the path metric values obtained at the present time, and selects a path related to the selected smallest path metric value. Data located at the end of the selected path is output as decoded data. The read signal of the magnetic recording/reproducing device 23 has the plus and minus polarities. With the above in mind, each of the assumed-path memory 31 and the path memory 33 is capable of storing three different numerals "−1", "0" and "1".

It is desired that the decoding system composed of the equalizer 24 and the Viterbi decoder 25 shown in FIG.2 be capable of decoding the read signal even if it has a low S/N ratio. The ability of the decoding system is primarily based on increase/decrease in high-frequency noise in the equalizer 24 and a lower limit of the S/N ratio at which the waveform-equalized read signal can be decoded. The above depends on the magnitude of intersymbol interference and the shape of the equalized signal. However, conventional Viterbi decoding systems as described above do not have an arrangement which adjusts the ability of the decoding system in accordance with the magnitude of intersymbol interference so as to maximize ability of the decoding system.

SUMMARY OF THE INVENTION

It is an object of the present invention to provide a Viterbi decoding system which maximize decoding ability in accordance with the magnitude of intersymbol interference.

This object of the present invention is achieved by a Viterbi decoding system comprising: characteristic estimating means for estimating a characteristic of a system; equalizer means, coupled to the characteristic estimating means and the system, for receiving an input signal from the system and for equalizing a waveform of the input signal so that an equalized waveform of the input signal is varied based on the characteristic of the system estimated by the characteristic estimating means; and Viterbi decoding means, coupled to the equalizer means, for generating an output signal showing a maximum-likelihood path by using the equalized waveform of the input signal from the equalizer means.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
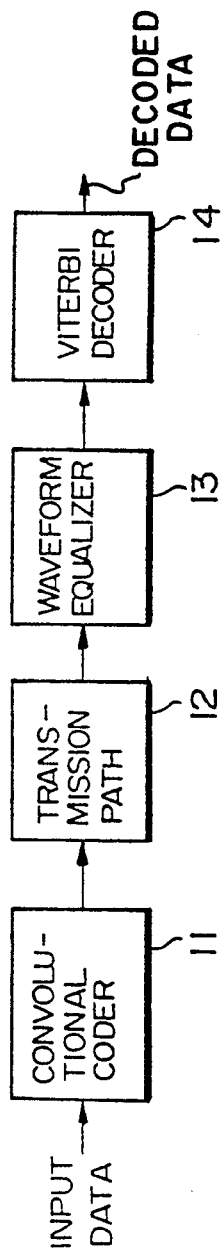
FIG.1 is a block diagram of a conventional data transmission, system.
Figure 2:
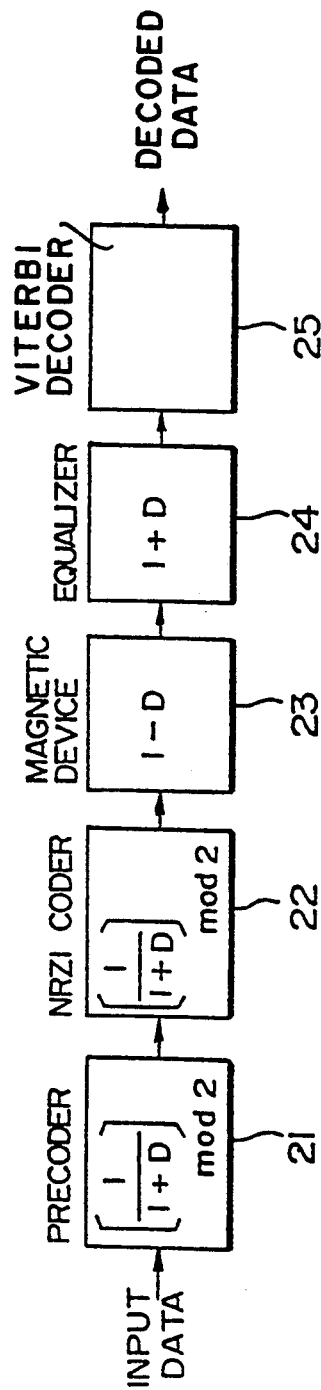
FIG.2 is a block diagram of a magnetic recording/reproducing apparatus which uses a Viterbi decoder.
Figure 3:
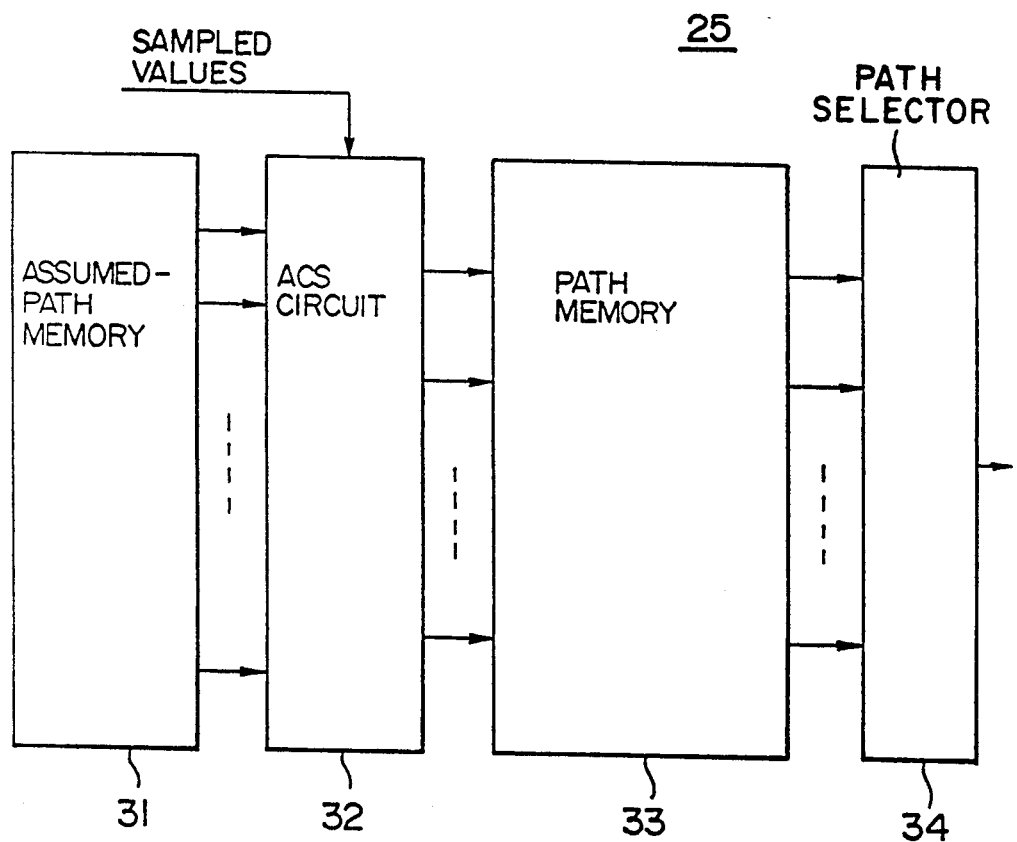
FIG.3 is a block diagram of a conventional Viterbi decoder.
Figure 4:
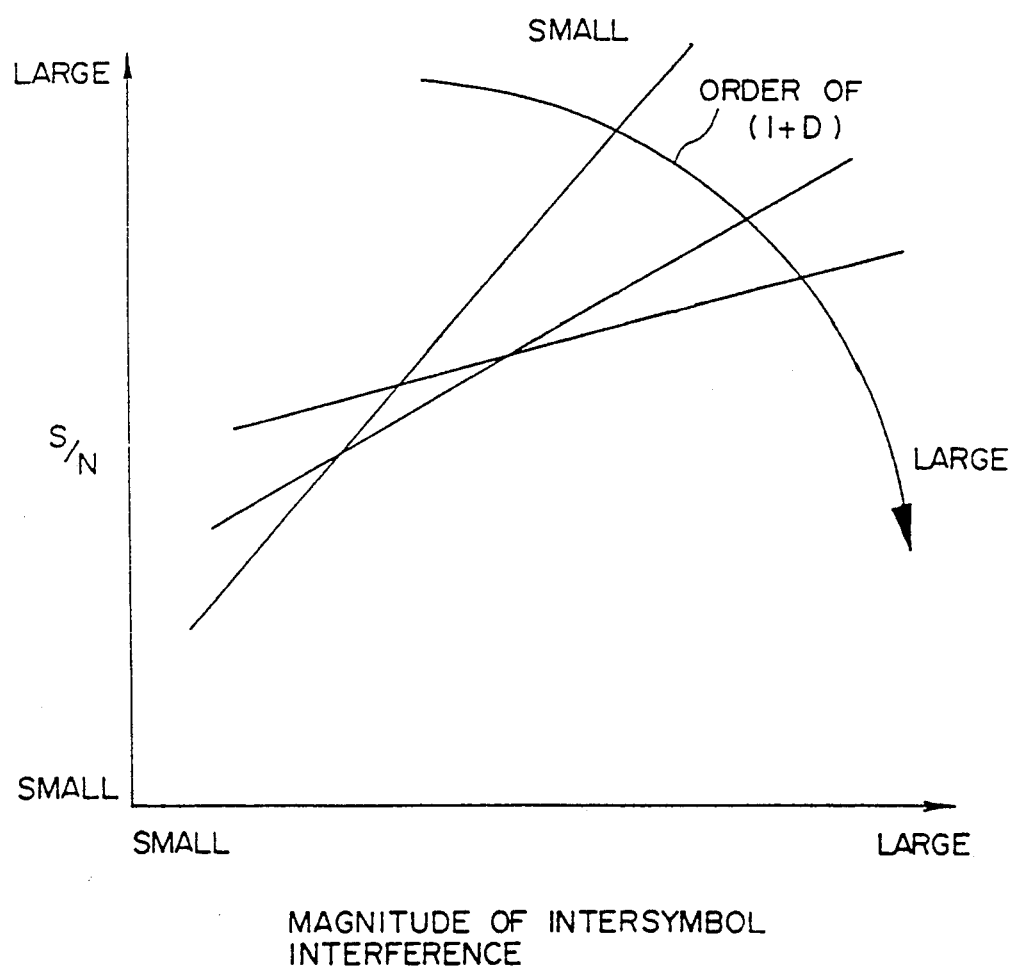
FIG.4 is a graph showing a relationship between an S/N ratio necessary to obtain a predetermined error rate and the magnitude of intersymbol interference.

A description will first be given, with reference to FIG.4, of the difference between the decoding ability and the magnitude of intersymbol interference. In FIG.4, the horizontal axis denotes the magnitude of intersymbol interference and the vertical axis denotes an S/N ratio of the signal input to the equalizer 24 (FIG.3) necessary to decode the signal input to the Viterbi decoder. Assuming that the order of $(1+D)$ of the equalizer 24 is a parameter, the relationship between the S/N ratio of the input signal and the magnitude of intersymbol interference necessary to decode the signal input to the Viterbi decoder is as shown in FIG.4. The smallest S/N ratio necessary to decode the signal input to the Viterbi decoder is obtained when there is small intersymbol interference in a state where the equalizer 24 has the smallest order. As intersymbol interference increases, the S/N ratio necessary to decode the signal input to the Viterbi decoder increases.

On the other hand, as the order of $(1+D)$ increases, the S/N ratio necessary to decode the signal input to the Viterbi decoder decreases if there is large intersymbol interference. Hence, it becomes easy to decode the read signal having large intersymbol interference. If there is small intersymbol interference, the S/N ratio necessary to decode the signal input to the Viterbi decoder increases. With the above in mind, it may be possible to provide a plurality of equalizers 64 and a plurality of Viterbi decoders 65. One of the equalizers 24 and one of the Viterbi decoders 25 are selected in accordance with the magnitude of intersymbol interference. However, this increases the circuit scale and the production cost.

Figure 5:
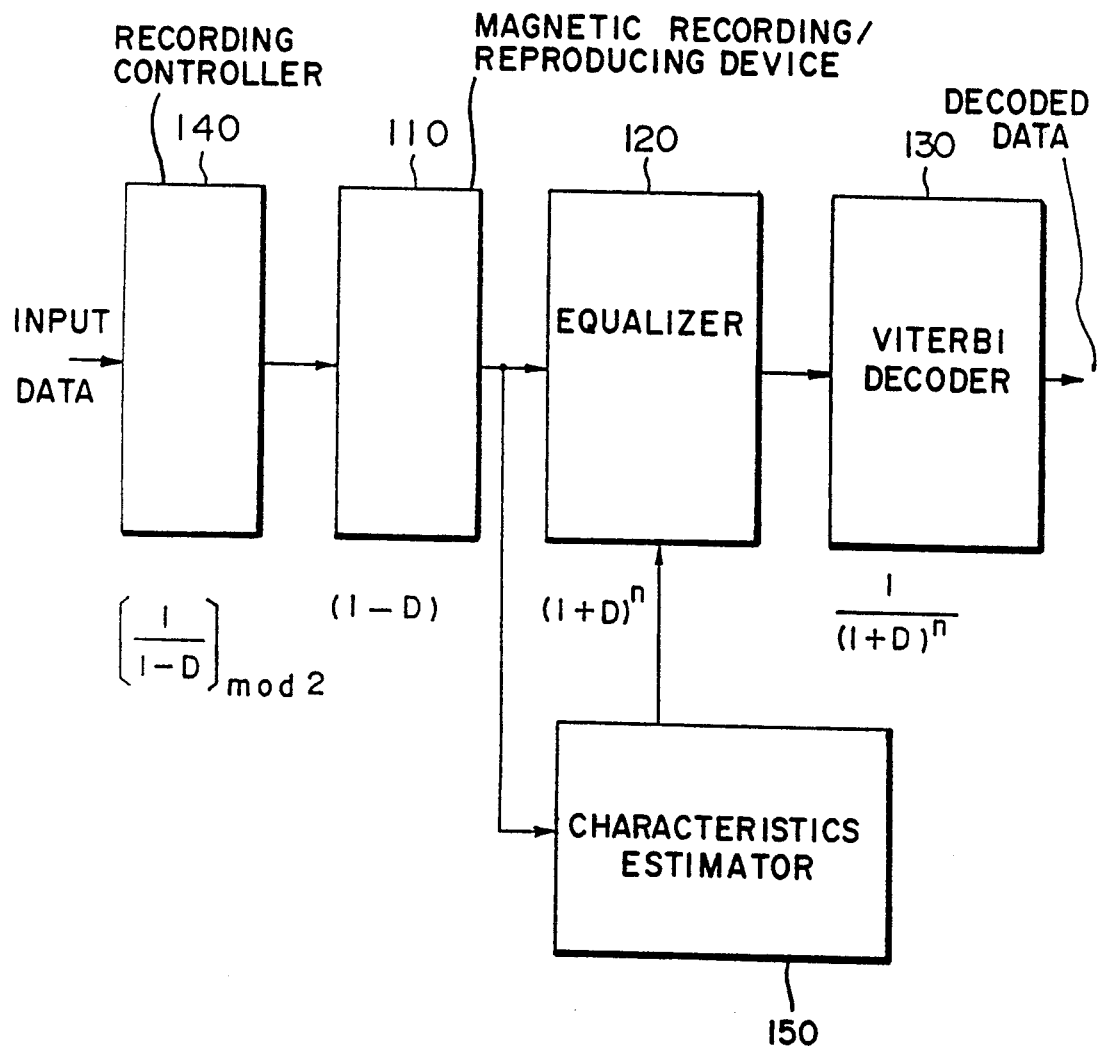
FIG.5 is a block diagram of a first embodiment of the present invention.

FIG.5 is a block diagram of a magnetic recording/reproducing apparatus which uses a Viterbi decoding system according to a first preferred embodiment of the present invention. The apparatus shown in FIG.5 is composed of a magnetic recording/reproducing device 110, an equalizer 120, a Viterbi decoder 130, a recording controller 140 and a characteristic estimator 150. The recording controller 140 records data on a recording medium built in the magnetic recording/reproducing device 110. A read data train from the magnetic recording/reproducing device 110 is equalized so that the read data train has a waveform of $(1+D)^n$ where D is a delay time of a bit period and n is an integer. The characteristic estimator 150 estimates the characteristic (normalized linear density) of a magnetic recording (transmission) system of the magnetic recording/reproducing device 110. In other words, the characteristic estimator 150 estimates the magnitude of intersymbol interference.

The equalizer 120 has a characteristic of $(1+D)^n$, and the order n of the characteristic estimator 150 is changed in accordance with the characteristic of the recording (transmission) system (the magnitude of intersymbol interference) estimated by the characteristic estimator 150. The equalizer 120 can be formed with a transversal filter having a plurality of tap coefficients. The characteristic estimator 150 selects the tap coefficients in accordance with the magnitude of intersymbol interference so that the greatest decoding ability can be obtained.

The Viterbi decoder 130 calculates the differences between the sampled values obtained by quantizing the output signal of the equalizer 120 and the expected values obtained from the waveforms $(1+D)^n$ of various data trains, and determines a maximum-likelihood path to be decoded data. The Viterbi decoder 130 can decode equalized waveforms of $(1+D)^n$ where n is an arbitrary order equal to or smaller than $(L-1)$ where L is the constraint length. Hence, the single Viterbi decoder 130 can execute an optimal decoding based on the magnitude of intersymbol interference in a range $1 < n < (L-1)$. Even if the read data signal from the apparatus 110 has a small S/N ratio, error-corrected decoded data can be reproduced.

The polarity of the read signal from the magnetic recording/reproducing device 110 alternately switches to plus and minus with respect to recorded data "1". With the above in mind, a counter, which increases by 1 each time decoded data "1" is generated by the Viterbi decoder 130, is provided for the Viterbi decoder 130. If the initial polarity of the reproduced data is the minus polarity, the next read signal obtained in the state where the counter indicates an odd counter value has the minus polarity if the delay time due to the number of stages of a path memory built in the Viterbi decoder 130 is ignored. When the counter value is even, the next read signal has the plus polarity. That is, the polarity of the signal input to the Viterbi decoder 130 can be discriminated. Hence, it becomes possible to reduce the number of assumed paths and the number of path memories to half the numbers thereof used in the conventional structure. If the Viterbi decoder 130 has the same structure as the prior structure, it is possible to double the constraint length.

Figure 6:
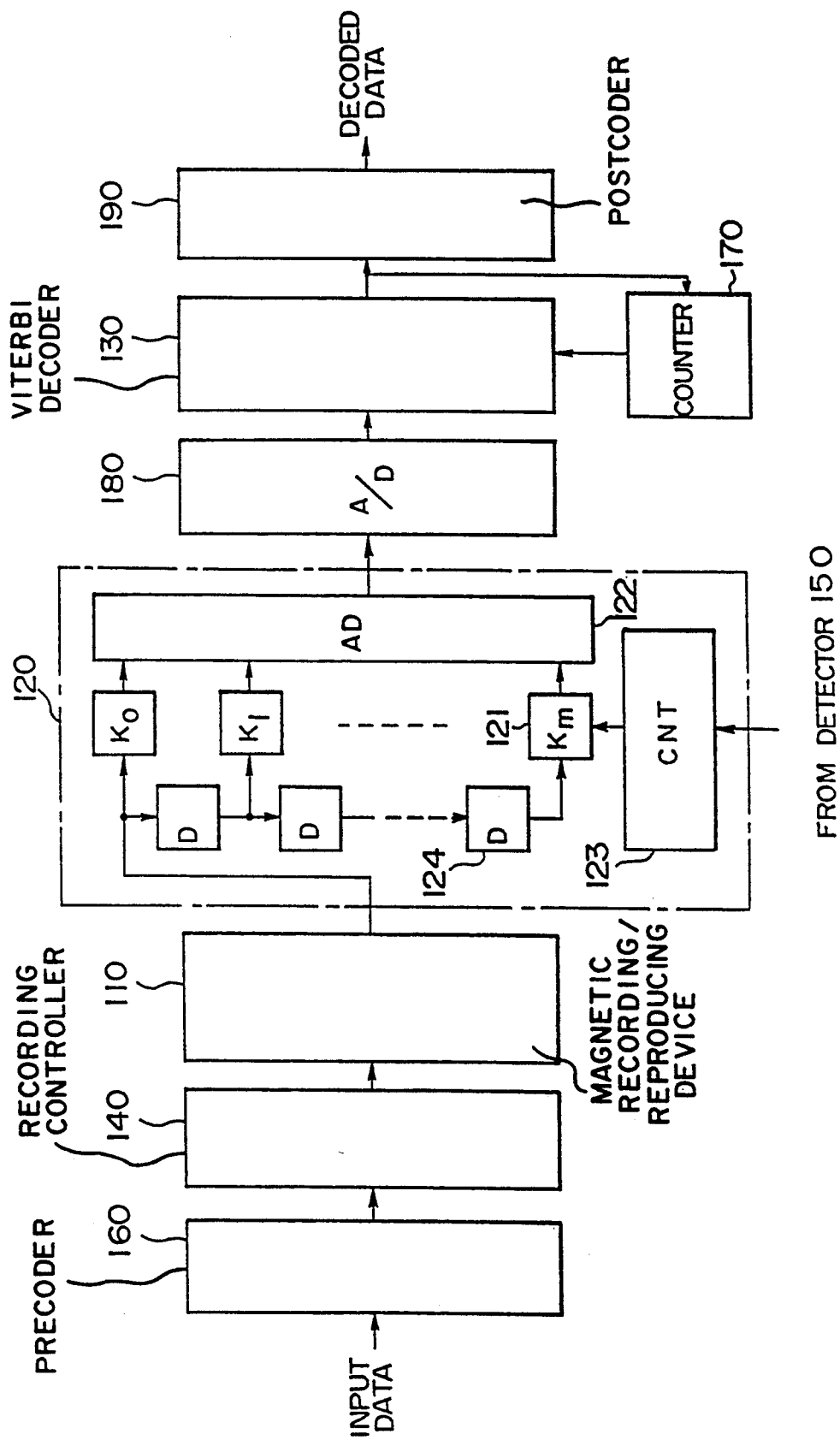
FIG.6 is a block diagram showing the first embodiment of the present invention shown in FIG.5 in more detail.

FIG.6 shows the structure shown in FIG.5 in more detail. In FIG.6, parts which are the same as those shown in FIG.5 are given the same reference numerals. In addition to the structural elements 110-150, the configuration shown in FIG.6 includes a precoder 160, a counter 170, an A/D (Analog to Digital) converter 180 and a postcoder 190. The precoder 160 is located on the input side of the recording controller 140. The A/D converter 180 is interposed between the equalizer 120 and the Viterbi decoder 130. The counter 170 receives the output signal of the Viterbi decoder 130 and outputs a counter value to the Viterbi decoder 130. The postcoder 190 is arranged on the output side of the Viterbi decoder 130.

The equalizer 120 has a transversal filter structure and includes delay elements 124, each having a delay time corresponding to one bit, coefficient multipliers 121, an adder (AD) 122 and a coefficient controller (CNT) 123. The controller 123 determines coefficients $K0, K1, \ldots, Km$ (m is an integer) of the coefficient multipliers 121 in accordance with the magnitude of intersymbol interference detected by the characteristic estimator 150. By adjusting the coefficients $K0-Km$, it becomes possible to obtain different waveform equalizing characteristics. In other words, a desired waveform-equalizing characteristic can be obtained by adjusting the coefficients $K0-Km$. It is possible to omit the precoder 160, the postcoder 190 and the counter 170 or omit only the counter 170.

The precoder 160 has a characteristic of $1(1+D)^n]$mod2, and the postcoder 190 has a characteristic of $[1(1+D)^n]$mod2. Since the recording controller 140 records data on the apparatus 110 in the NRZI recording manner, the recording controller 140 has a characteristic of $[1/(1+D)]$mod2 as in the case of the conventional structure. The magnetic recording/reproducing apparatus 110 has a characteristic of $(1-D)$ since it generates the read signal which has the plus and minus polarities. The order n of $(1+D)^n$ can be altered by changing the setting of the coefficients $K0-Km$ of the coefficient multipliers 121 of the equalizer 120.

Figure 7:
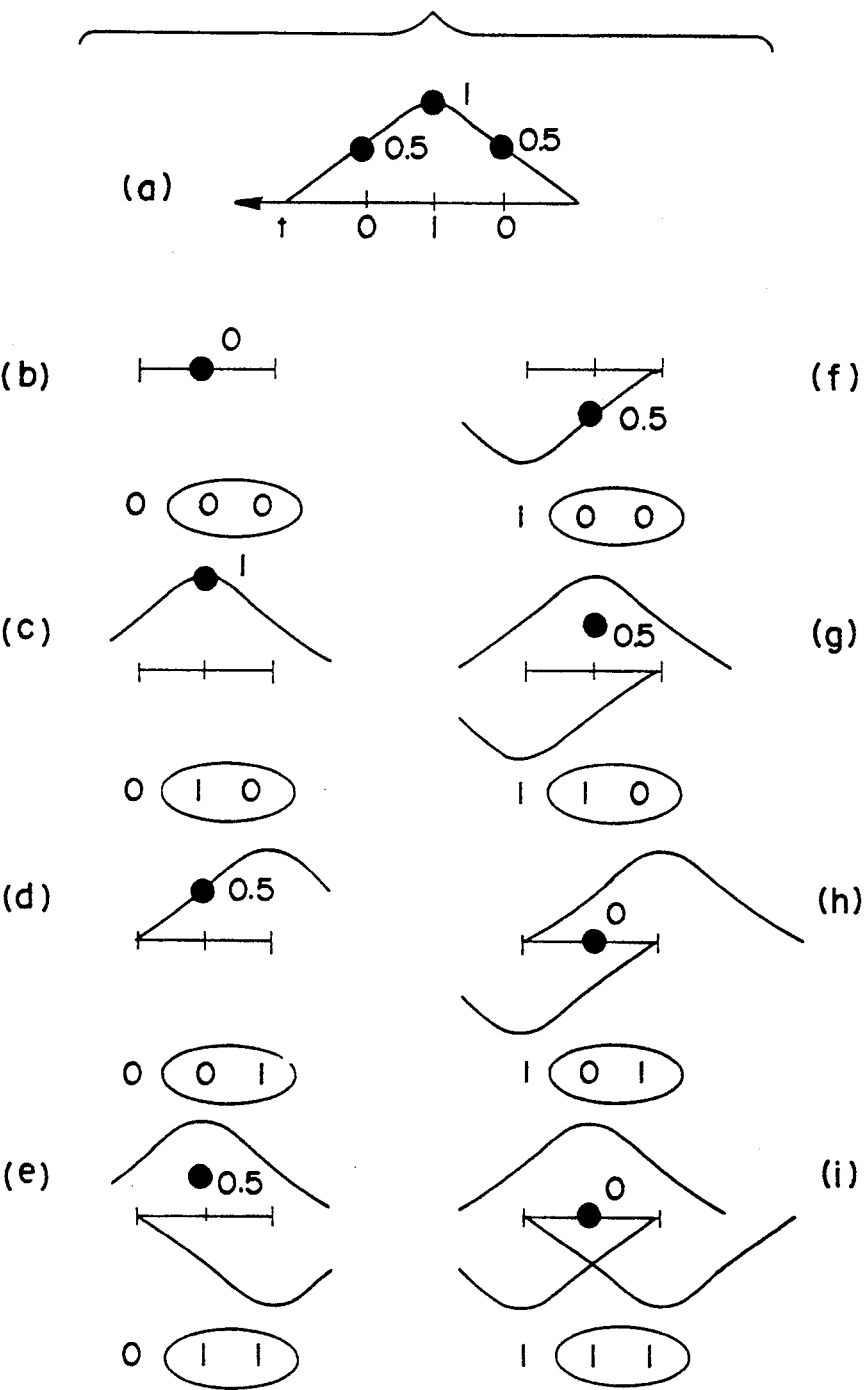
FIG.7 is a diagram showing data trains and expected values with respect to an equalized waveform of $(1+D)^2$.
Figure 8:
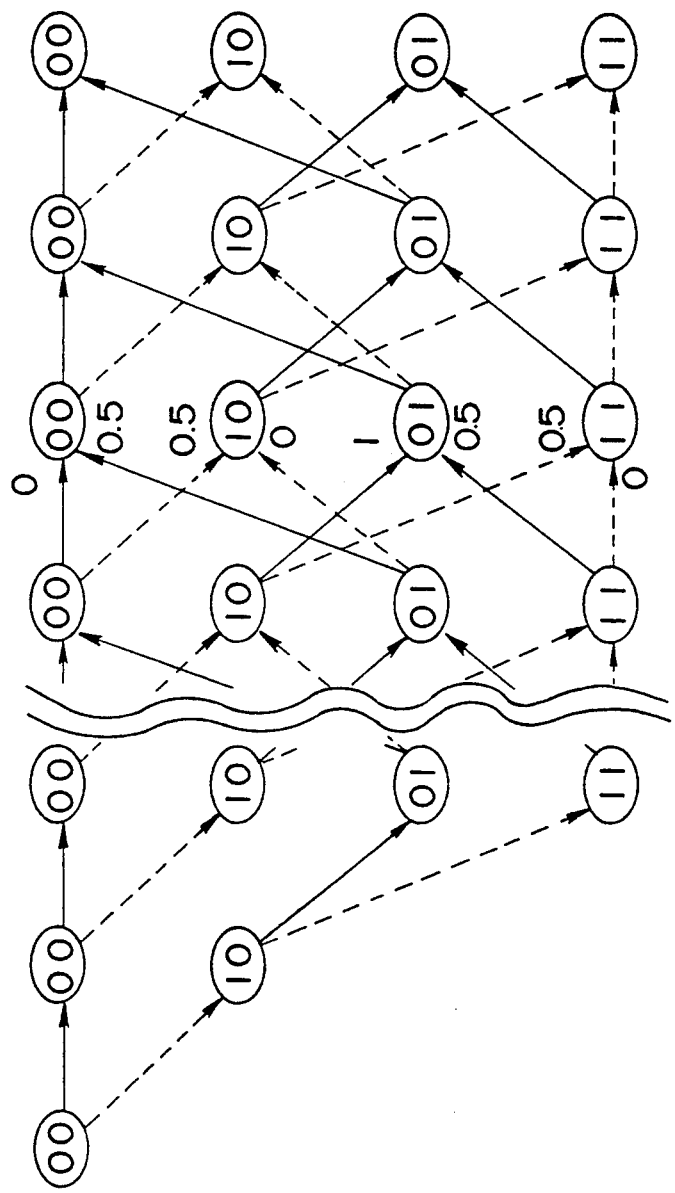
FIG.8 is a trellis diagram of a Viterbi decoder with respect to the equalized waveform $(1+D)^2$.

FIG.7 is a diagram showing data trains and expected values with respect to an equalized waveform $(1+D)^2$, and FIG.8 is a trellis diagram of the Viterbi decoder 130 with respect to this equalized waveform in a state where the constraint length is equal to 3. FIG.7(a) shows an isolated waveform obtained when a peak value is equal to 1. A symbol "●" denotes an expected value related to the waveform of each data train. For example, FIG.7(b) shows a data train composed of consecutive zeros, and FIG.7(c) shows a data train in which data immediately prior to "1" is "0" and data following "1" is also "0". The waveform shown in FIG.7(c) is almost the same as that shown in FIG.7(a). FIG.7(f) shows a data train in which "0", "0" and "1" are input in this sequence. The expected value with respect to the equalized waveform (data train) is $-0.5$.

Referring to FIG.8, transition occurs in a direction indicated by a solid line when data input to the Viterbi decoder 130 is "0", and transition occurs in a direction indicated by a broken line when data input to the Viterbi decoder 130 is "1". The circles shown in FIG.8 denote internal states. When input data is "0" in the state where the internal state is "01", the internal state shifts in the direction indicated by the solid line, and hence the next internal state is "00". When input data is "1" in the same state as described above, the internal state shifts in the direction indicated by the broken line, and hence the next internal state is "10". In the same manner as described above, when input data is "0" in the state where the internal state is "10", the next internal state is "01". When input data is "1" in the same state as described above, the next internal state is "11".

Figure 9:
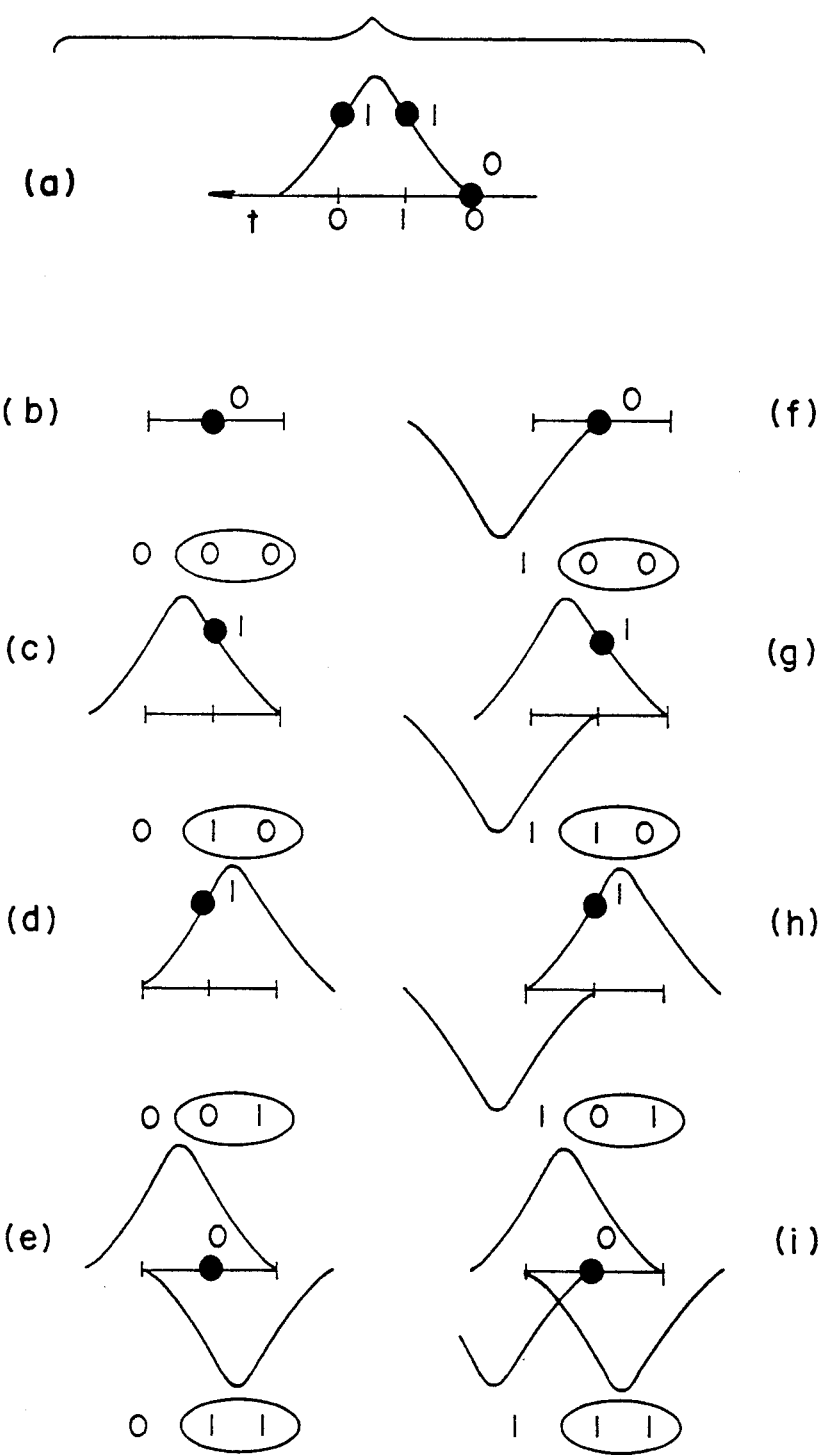
FIG.9 is a diagram showing data trains and expected values with respect to an equalized waveform $(1+D)$.
Figure 10:
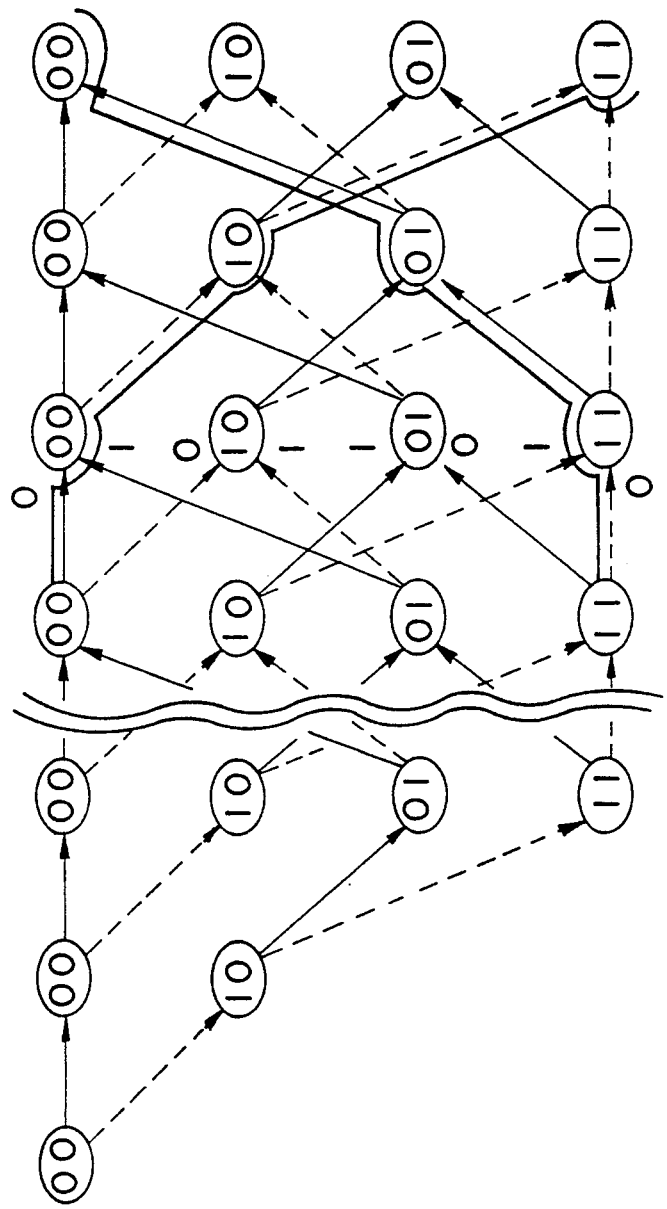
FIG.10 is a trellis diagram of a Viterbi decoder with respect to the equalized waveform $(1+D)$.

FIG.9 is a diagram showing data trains and expected values with respect to an equalized waveform $(1+D)$, and FIG. 10 is a trellis diagram of the Viterbi decoder 130 with respect to the equalized waveform. As has been described previously, it is possible to change the characteristic of the equalizer 120 from $(1+D)^n$ to $(1+D)$. The decoding is carried out by using the aforementioned Viterbi decoder 130 having a constraint length of 3. By the superimposing of waveforms, an expected value (indicated by "●") of each data train is obtained. The transition process shown in FIG.8 is the same as that shown in FIG.10. Hence, by using a single Viterbi decoder, it is possible to decode information contained in the equalized waveform $(1+D)^n$ and equalized waveform $(1+D)$.

When the equalized waveform $(1+D)$ is used in the case where the precoder 160 is not used, there is a possibility that transitions indicated by the thicker solid lines in FIG.10 may occur if there is large intersymbol interference and an error occurs. That is, the maximum-likelihood path does not converge, and hence decoded data cannot be obtained correctly. In cases as described above, the precoder 160 having the characteristic $[1/(1+D)]$mod2 and the postcoder 190 having the reverse characteristic are used in the manner as shown in FIG.6. With this arrangement, it becomes possible to correctly execute the decoding procedure in the Viterbi decoder 130.

The counter 170 shown in FIG.6 increases its counter value by 1 each time decoded data "1" is input thereto from the Viterbi decoder 130. The counter value or its least significant bit is input to the Viterbi decoder 130. With this arrangement, it becomes possible to discriminate the polarity of the equalized output signal from the equalizer 120. That is, the read signal from the magnetic recording/reproducing device 110 alternately switches to the plus and minus polarities, and hence the output signal of the equalizer 120 obtained via the A/D converter 180 alternately switches to the plus and minus polarities, as shown in FIG.7 or FIG.10. If the signal having the minus polarity is $-1$, the Viterbi decoder 130 executes the decoding procedure using three levels, $-1$, $0$ and $+1$.

Meanwhile, it is possible to discriminate the polarity of the read signal by using the contents of the counter 170. In this manner, it becomes possible to discriminate the polarity of the input signal of the Viterbi decoder 130. As a result, it becomes possible for the Viterbi decoder 130 to handle either the plus polarity or the minus polarity and hence diminish the circuit scale. It will be noted that a delay time corresponding to the number of stages of the path memory built in the Viterbi decoder 130 is known and hence it is possible to determine the results of polarity discrimination by means of the counter 170 and the polarity of the input signal, taking into consideration the above delay time.

Figure 11:
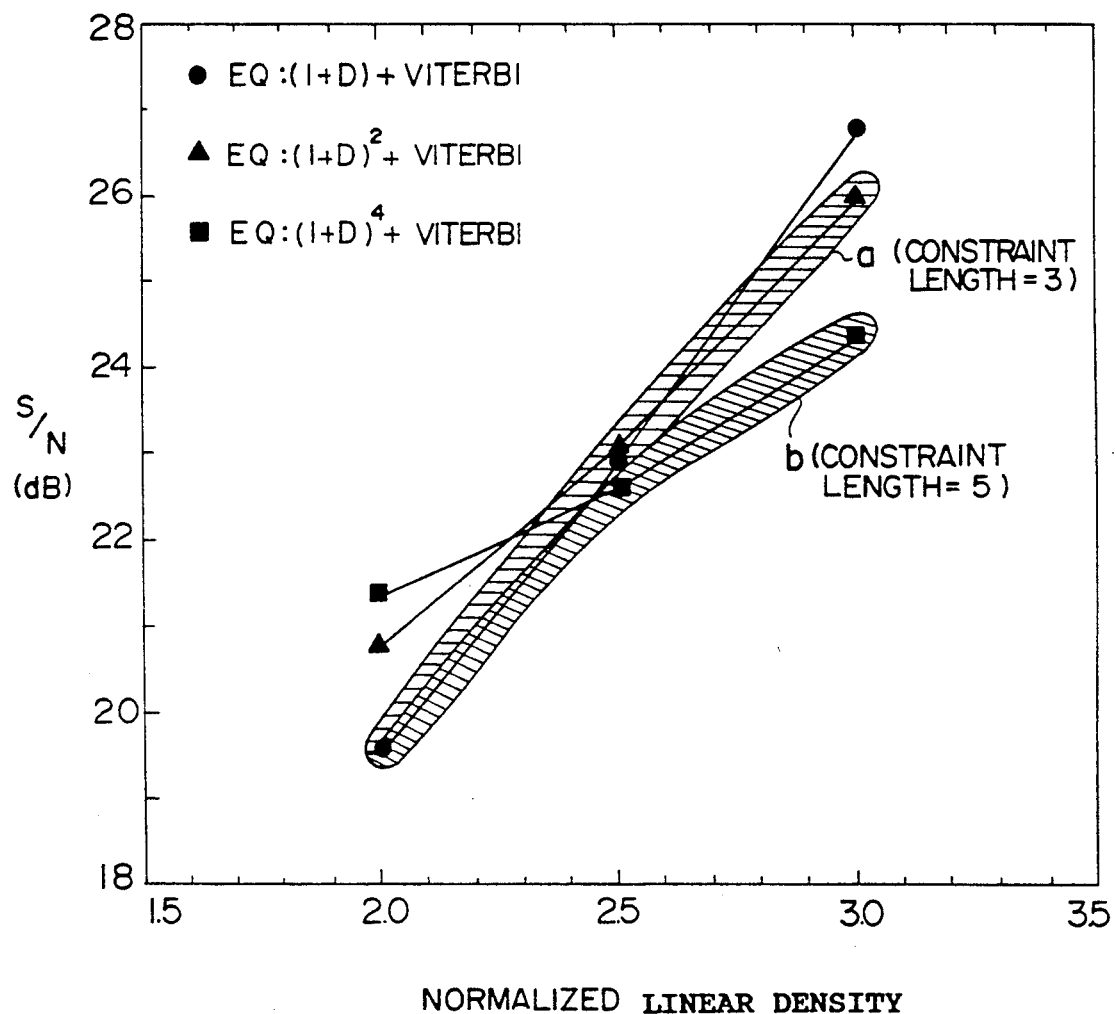
FIG. 11 is a graph of a relationship between an S/N ratio necessary to obtain a predetermined error rate and a normalized linear density.

FIG.11 is a diagram showing the relationship between a normalized linear density and the S/N ratio. In FIG.11, the horizontal axis denotes the normalized linear density, and the vertical axis denotes the S/N ratio. The normalized linear density, which corresponds to the characteristic of the magnetic recording (or transmission) system, is defined as (a half-width of a Lorents waveform)/(bit period). The S/N ratio denoted by the vertical axis is an S/N ratio necessary to obtain an error rate of $10^{-9}$. Symbols "●" shown in FIG.11 are related to a case where an equalized waveform of $(1+D)$ is used, symbols "▲" are related to a case where an equalized waveform of $(1+D)^2$ is used, and symbols "■" are related to a case where an equalized waveform of $(1+D)^4$ is used. An increase in the normalized linear density increases intersymbol interference. When the normalized linear density is equal to 2, the S/N ratio necessary to obtain the above-mentioned predetermined error rate when the equalized waveform $(1+D)$ is used is the smallest. When the normalized linear density is equal to 2.5, the S.N ratios with respect to the respective equalized waveforms are almost the same as each other. When the normalized linear the predetermined error rate when the equalized waveform $(1+D)^4$ is used is the smallest.

It can be seen from the above that when the Viterbi decoder 130 (FIG.6) having a constraint length of 3 the equalizer 120 (FIG.6) is controlled as follows. As indicated by "a" shown in FIG.11, the coefficients of the coefficient multipliers 121 are controlled by the controller 123 so that the equalizer 20 functions as an equalizer having a characteristic $(1+D)^2$ when the normalized linear density is larger than or equal to 2.5 and that the equalizer 120 functions as an equalizer having a characteristic $(1+D)$ when the normalized linear density is smaller than 2.5. In the above manner, it becomes possible to configure a decoding system having a small S/N ratio necessary to obtain the predetermined error rate by means of the single Viterbi decoder 130. When the Viterbi decoder 130 has a constraint length of 5, as indicated by "b" shown in FIG.11, the coefficients of the coefficient multipliers 121 are controlled so that the equalizer 120 functions as an equalizer having a characteristic $(1+D)^4$ when the normalized linear density is larger than or equal to 2.5 and so that the equalizer 120 functions as an equalizer having a characteristic $(1+D)$ when the normalized linear density is lower than 2.5. In this manner, it becomes possible to configure a decoding system having a small S/N ratio necessary to obtain the predetermined error rate by means of the single Viterbi decoder 130.

In the case where the normalized linear density based on the characteristic of the magnetic recording/reproducing device 110 can be obtained beforehand, it is possible to determine the characteristic of the equalizer 120 in accordance with the normalized linear density. Normally, the magnitudes of intersymbol interference obtained for tracks in a center portion of a magnetic disk are different from those of intersymbol interference obtained for tracks in an outer portion of the magnetic disk. Since these differences in the magnitude of intersymbol interference can be obtained beforehand, the controller 123 receives, from the characteristic estimator 150, an order control signal based on the current position of a magnetic head, and controls the coefficients of the coefficient multipliers 121 on the basis of the order control signal. During the control procedure, the coefficients are determined so that the equalizer 120 functions as an equalizer having a characteristic $(1+D)^4$ (n>2) when the normalized linear density is larger than or equal to 2.5 and as an equalizer having a characteristic $(1+D)$ (n=1) when the normalized linear density is smaller than 2.5.

In the above case, the controller 123 includes a memory Which receives, as an address signal, the order control signal based on the track position indicating signal and which outputs to the coefficient multipliers 121 coefficient setting signals which indicate the respective coefficients thereof.

Figure 12:
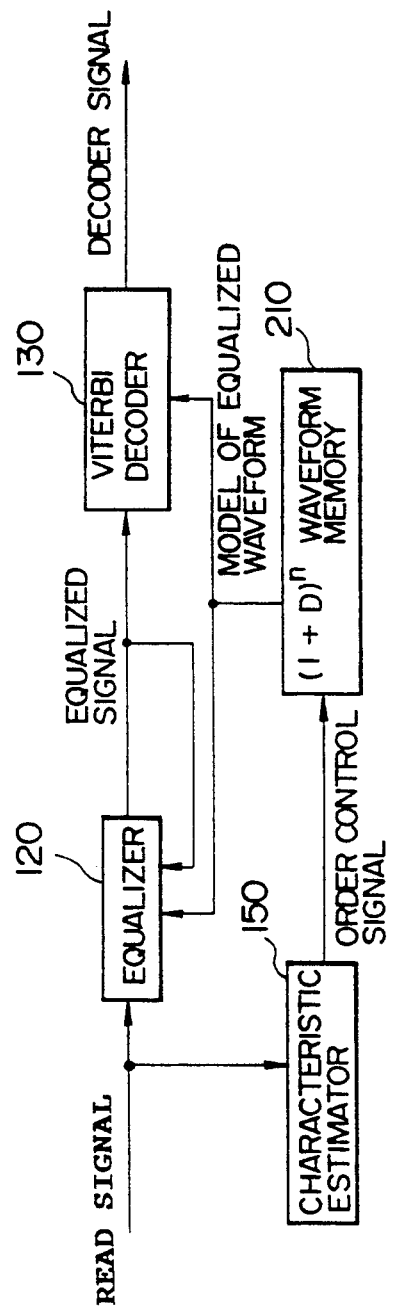
FIG.12 is a block diagram of a second embodiment of the present invention.

FIG.12 is a block diagram of a second embodiment of the present invention. The second embodiment of the present invention employs a waveform memory which stores waveforms of $(1+D)^n$. The order control signal output by the characteristic estimator 150 is input to the waveform memory 210.

Figure 13:
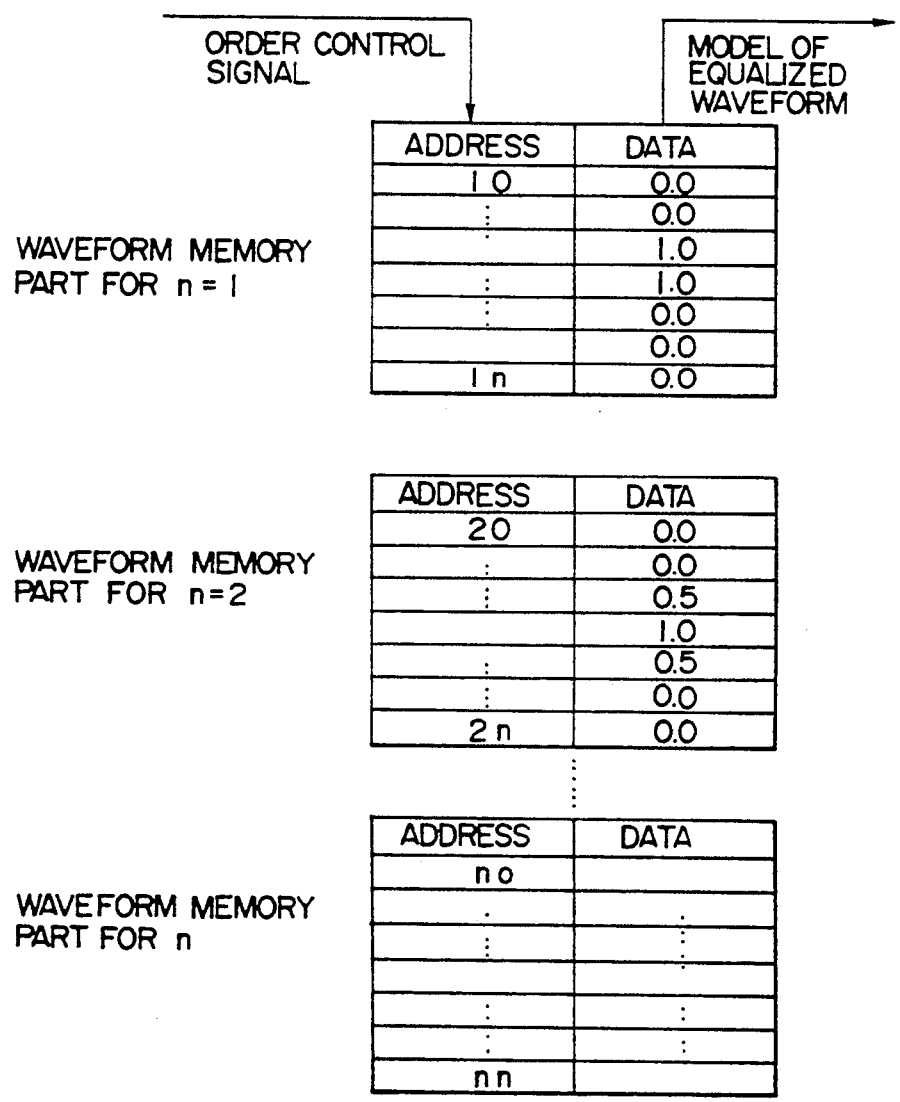
FIG.13 is a diagram of a waveform memory shown in FIG.12.

FIG.13 shows waveform data stored in the waveform memory 210, which can be formed with, for example, RAM or ROM. The waveform memory 210 stores waveform data for each n. In FIG.13, waveform data for n=1, 2 and n are shown. Waveform data can be specified by an address signal, which shows, on a high-order bit side thereof, the order to be set and shows, on a low-order bit side thereof, a time sequence of waveform data. The waveform data is a sampled value of the equalized waveform related to the order and the time sequence. The waveform data for n=1 shown in FIG.13 corresponds to the models of the equalized waveforms shown in FIG.9, and the waveform data for n=2 shown in FIG.13 corresponds to the models of the equalized waveforms shown in FIG.7. In response to the order indicated by the order control signal, the waveform data is output, as a model of the equalized waveform, to the equalizer 120 and the Viterbi decoder 130.

Figure 14:
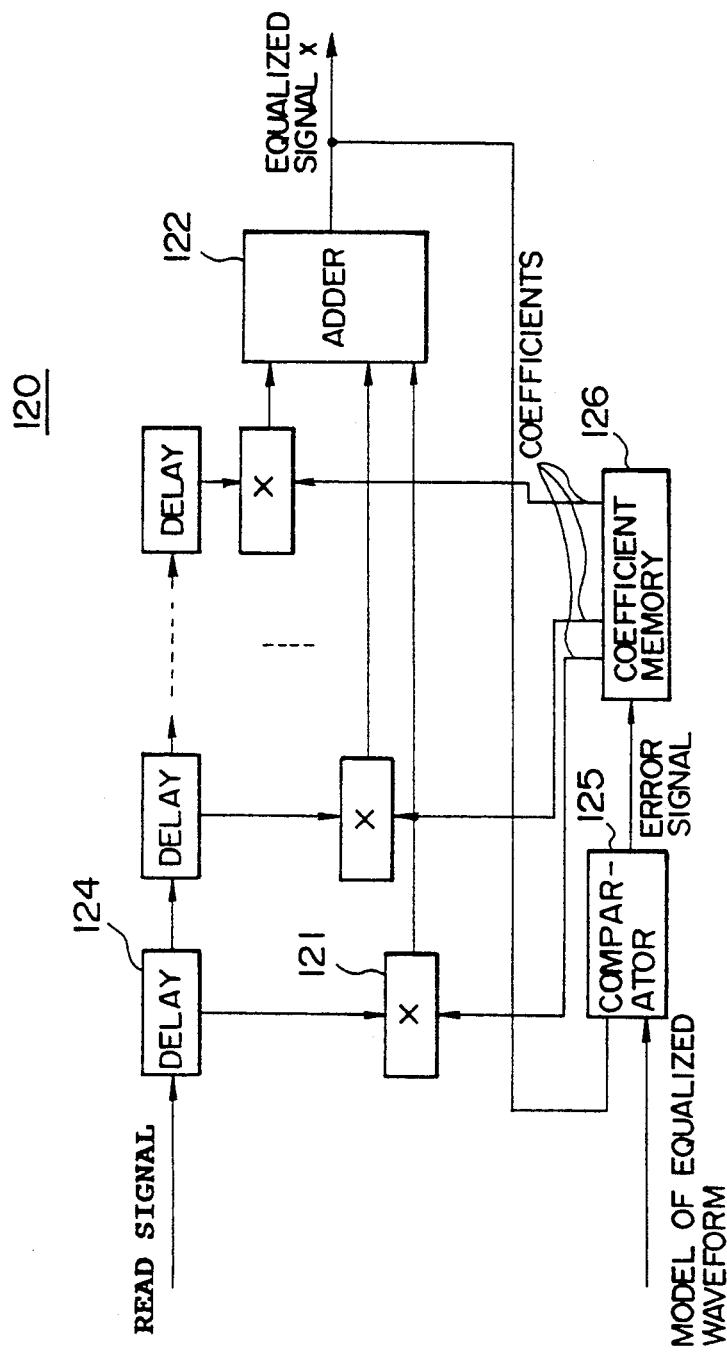
FIG.14 is a block diagram of an equalizer used in the second embodiment of the present invention.

FIG.14 is a block diagram of the equalizer 120 used in the second embodiment of the present invention. A comparator 125 and a coefficient memory 126 form a controller like the controller 123 shown in FIG.6. The equalizer 120 receives the read signal from the magnetic recording/reproducing device 110 and the model of the equalized waveform from the memory 210, and generates an equalized signal x therefrom. The comparator 125 compares the model of the equalized waveform with the equalized signal x, and generates an error signal indicating the difference between the model and the equalized signal x. The coefficient memory 126 stores coefficients of the coefficient multipliers 121 specified by addresses based on errors. The coefficients are selected so that the error is eliminated.

Figure 15:
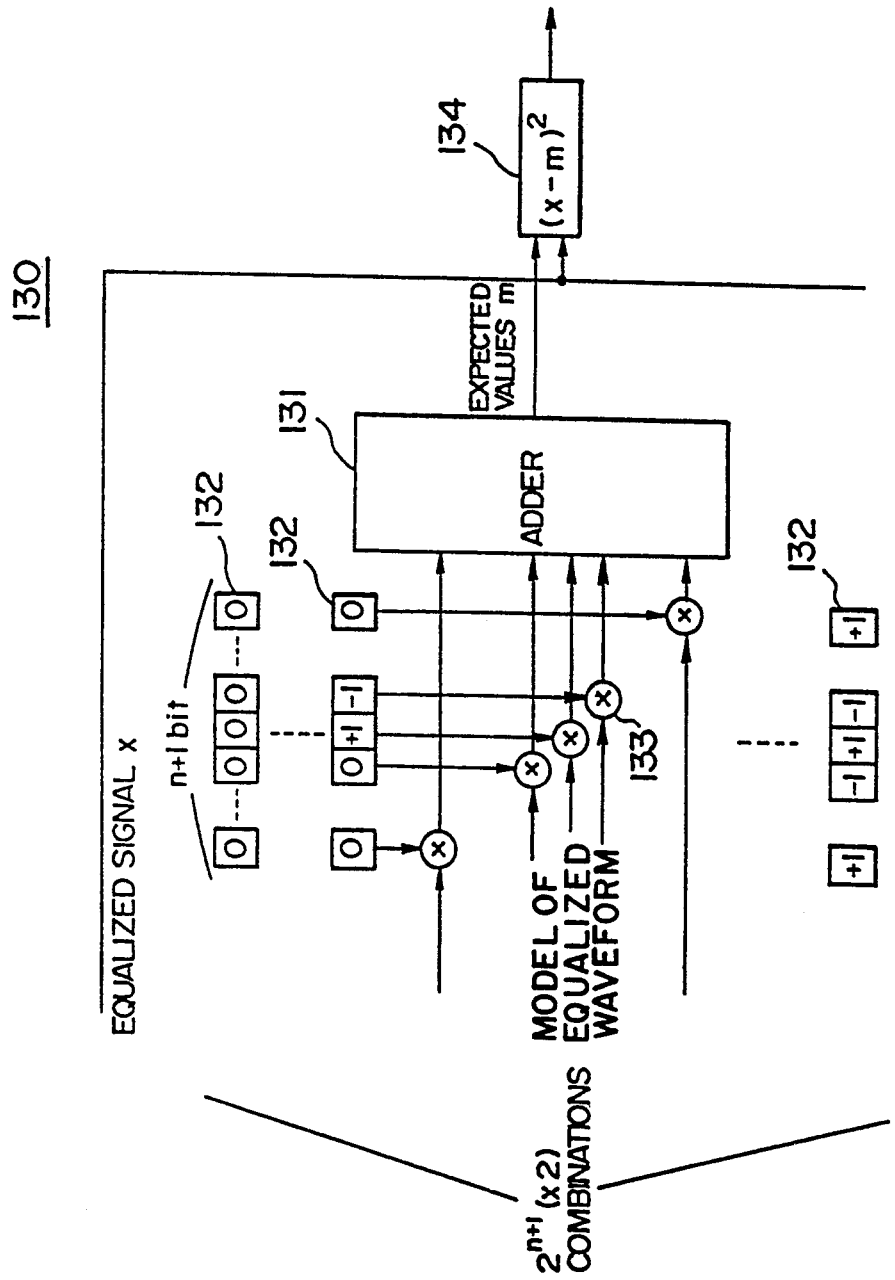
FIG.15 is a diagram of a Viterbi decoder used in the second embodiment of the present invention.

FIG.15 is a block diagram of a part of the Viterbi decoder 130 used in the second embodiment of the present invention. As shown in FIG.15, the Viterbi decoder 130 is composed of $2^{n+1}$ calculation circuits each having an (n+1)-bit register 132 and a multiplier 133, and an adder 131. When the counter 170 shown in FIG. 6 is used, the $2^{n+1}$ calculation circuits (assumed data trains) are used. When the counter 170 shown in FIG. 6 is not used, $(2^{n+1} \times 2)$ calculation circuits (assumed data trains) are used. Each of the calculation circuits receives the related waveform-equalized model and an assumed data train consisting of n+1 bits, and multiplies the corresponding bits with each other. In this manner, the output bits of the multipliers 133 in each of the calculation circuits are added to each other by the adder 1313, the hence $2^{n+1}$ (or $\times 2$) expected values are generated. A calculation unit 134 calculates the square of the difference between the equalized signal and each of the expected values m, that is, $(x-m)^2$.

Figure 16A:
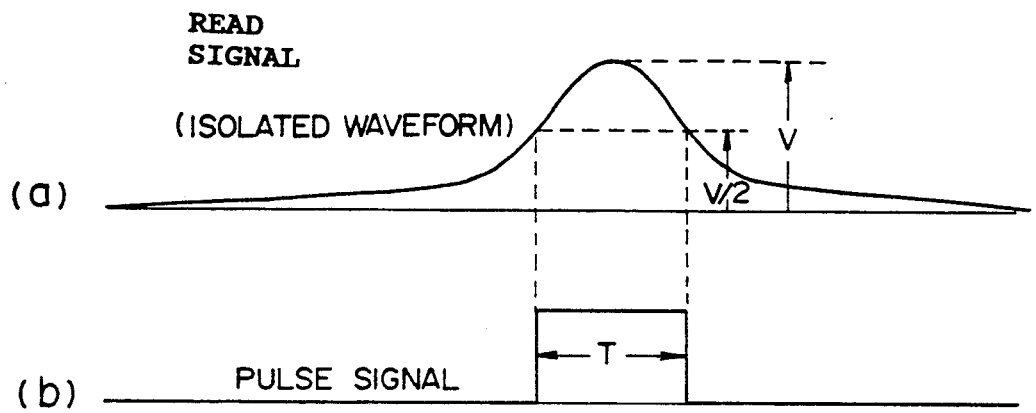
FIGS.16A and 16B are diagrams of a characteristic estimator.
Figure 16B:
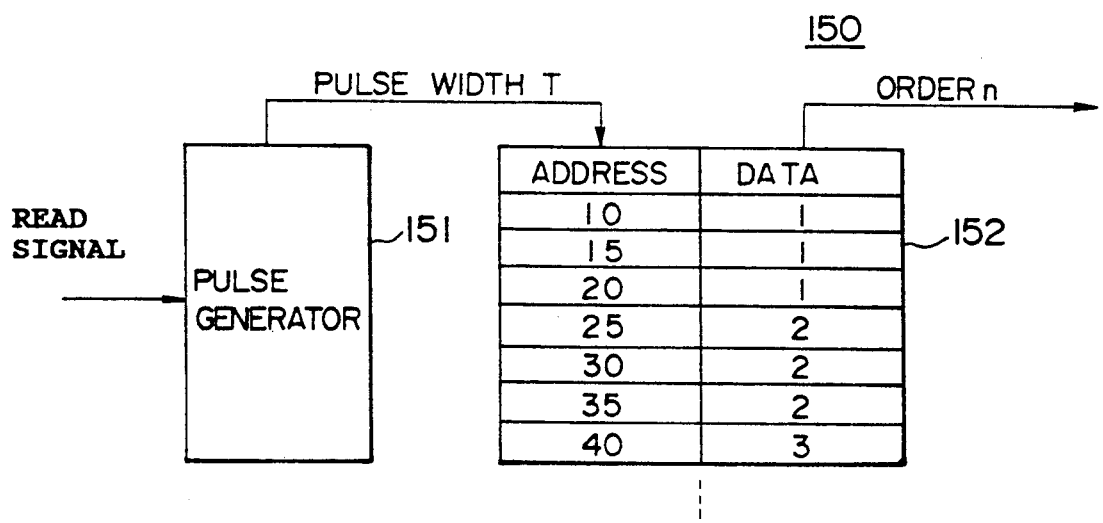

FIGS.16A and 16B are diagrams showing the characteristic estimator 150 used in the second embodiment of the present invention. FIG.16A(a) shows an isolated waveform of the read signal from the magnetic recording/reproducing device 110. The isolated waveform of the read signal serves as a special pattern for evaluating the magnetic recording system (transmission system). The isolated waveform of the read signal obtained in the magnetic recording system can be approximated to a Lorents waveform. The characteristic estimator 150 slices an amplitude V of the isolated waveform at V/2, as shown in FIG.16A(a), and generates a pulse signal having a time (pulse) width T. The characteristic of the magnetic recording system can be estimated based on the pulse width T. It is also possible to estimate the characteristic of the magnetic recording system by integrating the pulse signal by an integration circuit (not shown) and convert an integrated signal into a voltage signal.

FIG.16B shows the structure of the characteristic estimator 150. As shown in FIG.16B, the characteristic estimator 150 is composed of a pulse generator 151 and a memory 152. The pulse generator 151 functions as has been described with reference to FIG.16A. The pulse width T is input, as an address signal, to the memory 152, which stores data indicating the order n of $(1+D)$. When the pulse width T indicates an address between, for example, 10 and 20, the order n is set to 1. In this case, the equalizer 120 has a characteristic $(1+D)$.

Figure 17A:
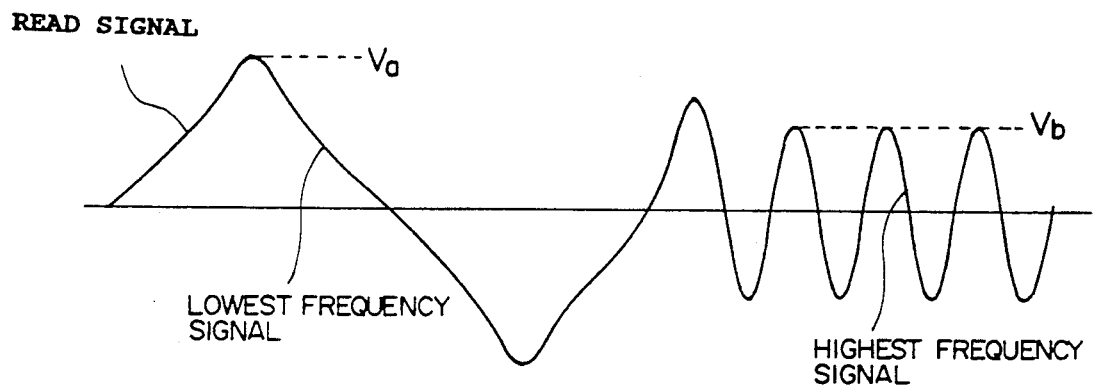
FIGS.17A and 17B are diagrams showing another configuration of the characteristic estimator.
Figure 17B:
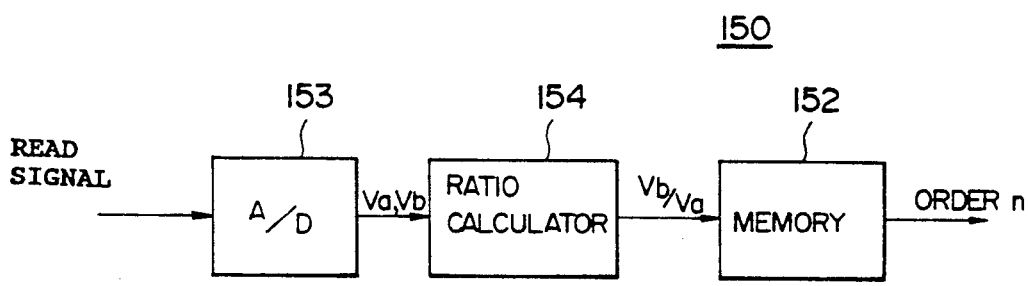

FIG.17A is another waveform diagram of the read signal from the magnetic recording/reproducing device 110, and FIG.17B is a block diagram of the structure of the characteristic decoder 150 different from that shown in FIG.16B. As shown in FIGS.17A and 17B, an A/D converter 153 detects an amplitude Va of the read signal having a lowest frequency and an amplitude Vb thereof having a highest frequency. The detected amplitudes Va and Vb are given to a ratio calculator 154, which calculates a ratio of Vb to Va, that is, Vb/Va. The ratio Vb/Va is input, as an address signal, to the memory 152, which stores data indicating the order n for each address, as shown in FIG.16B.

In each of the above-mentioned embodiments, it is possible to switch the characteristic of the equalizer 120 between more than two characteristics if the Viterbi decoder 130 has a large constraint length.

The present invention is not limited to the specifically disclosed embodiments, and variations and modifications may be made without departing from the scope of the present invention.

What is claimed is:

1. A Viterbi decoding system comprising:
characteristic estimating means for estimating a characteristic of a system;
equalizer means, coupled to said characteristic estimating means and said system, for receiving an input signal from said system and for equalizing a waveform of said input signal so that an equalized waveform of said input signal is varied based on the characteristic of said system estimated by said characteristic estimating means; and
Viterbi decoding means, coupled to said equalizer means, for generating an output signal showing a maximum-likelihood path by using the equalized waveform of said input signal from said equalizer means, wherein
said equalizer means includes means for equalizing the waveform of said input signal to a waveform having a characteristic of $(1+D)^n$ where D is a unit delay time and n is an integer, and
said characteristic estimating means includes changing means for changing an order n of $(1+D)^n$ on the basis of the characteristic of said system.

2. A Viterbi decoding system as claimed in claim 1, wherein said Viterbi decoding means has a constraint length L where L is an integer, and
said changing means of said characteristic estimating means comprises means for changing the order n in a range $1 < n < (L-1)$ on the basis of the characteristic of said system.

3. A Viterbi decoding system as claimed in claim 1, wherein
said characteristic estimating means comprises normalized linear density detecting means for detecting a normalized linear density, and
said changing means of said characteristic estimating means comprises means for setting the order n to 1 when the normalized linear density is lower than 2.5 and for setting the order n to a value larger than 1 when the normalized linear density is larger than or equal to 2.5.

4. A Viterbi decoding system as claimed in claim 3, wherein the normalized linear density is equal to 1.

5. A Viterbi decoding system, comprising:
characteristic estimating means for estimating a characteristic of a system;
equalizer means, coupled to said characteristic estimating means and said system, for receiving an input signal from said system and for equalizing a waveform of said input signal so that an equalized waveform of said input signal is varied based on the characteristic of said system estimated by said characteristic estimating means; and
Viterbi decoding means, coupled to said equalizer means, for generating an output signal showing a maximum-likelihood path by using the equalized waveform of said input signal from said equalizer means, wherein
said characteristic estimating means includes detecting means for detecting a waveform of a special evaluation pattern from said system and for estimating the characteristic of said system on the basis of the waveform of said special evaluation pattern,
pulse signal generating means for comparing an amplitude of said special evaluation pattern with a predetermined threshold level and for generating a pulse signal having a pulse width corresponding to a period during which the amplitude of said special evaluation pattern is equal to or greater than the predetermined threshold level, and
memory means, coupled to said pulse signal generating means, for storing a plurality of values of the order n based on different pulse widths of said pulse signal and for outputting one of the values of the order n related to the pulse width of said pulse signal generated by said pulse signal generating means.

6. A Viterbi decoding system as claimed in claim 1, wherein said characteristic estimating means comprises ratio generating means for generating a ratio of an amplitude of said input signal obtained when said input signal has a highest frequency to an amplitude of said input signal obtained when said input signal has a lowest frequency and for estimating the characteristic of said system on the basis of the ratio.

7. A Viterbi decoding system as claimed in claim 6, wherein said characteristic estimating means comprises memory means, coupled to said ratio generating means, for storing a plurality of values of the order n based on different values of said ratio and for outputting a corresponding one of the values of the order n related to the ratio generated by said ratio generating means.

8. A Viterbi decoding system as claimed in claim 1, further comprising:
waveform memory means for storing models of n equalized waveforms and for outputting one of the models specified by the order n where n is produced by said changing means of said characteristic estimating means, and
wherein said equalizer means comprises multiplier means for multiplying, by coefficients, delayed input signals which are delayed versions of said input signal;
comparator means for comparing the equalized waveform of said input signal from said equalizer means with said one of the models from said waveform memory means and for generating an error signal indicating a comparison result; and
means for determining said coefficients which are output to said multiplier means on the basis of said error signal.

9. A Viterbi decoding system as claimed in claim 8, wherein said Viterbi decoding means includes
expected-value generating means for generating expected values from said one of the models and a plurality of assumed-data trains, and
calculating means for calculating a square of a difference between each of the expected values and said equalized waveform of said input signal.

10. A Viterbi decoding system as claimed in claim 8, wherein:
said input signal has plus and minus polarities; and
said models are related to either the plus polarity or the minus polarity.

11. A Viterbi decoding system as claimed in claim 1, further comprising:
counter means for counting a number of predetermined bit values included in said output signal and for determining a polarity of said input signal on the basis of the number of predetermined bit values; and
said Viterbi decoding means comprises means for generating said output signal on the basis of the polarity of said input signal.

12. A Viterbi decoding system as claimed in claim 1, wherein said system is a magnetic recording system and said input signal is a reproduced signal read from said magnetic recording system.

13. A Viterbi decoding system as claimed in claim 1, wherein said system is a data transmission system and said input signal is a data signal transmitted via said data transmission system.

14. A Viterbi decoding system as claimed in claim 1, wherein said Viterbi decoding means comprises a partial-response maximum-likelihood Viterbi decoder.

15. A Viterbi decoding system as claimed in claim 1, said system comprises a magnetic recording/reproducing device having a recording medium,
precoding means, provided on an input side of send magnetic recording/reproducing device, for precoding data recorded on said recording medium, said precoding means having a characteristic of $[1(1+D)^n \bmod 2] (1+D)^n$ modulo 2; and
postcoding means, coupled to said Viterbi decoding means, for postcoding said output signal, said postcoding means having a characteristic of $[(1(1+D)^n) \bmod 2] (1/(1+D)^n)$ modulo 2.

16. A Viterbi decoding system as claimed in claim 5, wherein said predetermined threshold level is equal to half the amplitude of said special evaluation pattern.

17. A Viterbi decoding system as claimed in claim 11, wherein said predetermined bit values are binary ones.

* * * * *